United States Patent
Lee et al.

(10) Patent No.: US 9,401,479 B2
(45) Date of Patent: Jul. 26, 2016

(54) METHOD OF MANUFACTURING DISPLAY APPARATUS INCLUDING TOUCH PATTERN UNIT

(71) Applicant: Samsung Display Co., Ltd., Yongin, Gyeonggi-Do (KR)

(72) Inventors: Jonghwan Lee, Yongin (KR); Taehwan Kim, Yongin (KR); Boram Lee, Yongin (KR); Sangil Kim, Yongin (KR); Jongseong Kim, Yongin (KR)

(73) Assignee: SAMSUNG DISPLAY CO., LTD. (KR)

( * ) Notice: Subject to any disclaimer, the term of this patent is extended or adjusted under 35 U.S.C. 154(b) by 0 days.

(21) Appl. No.: 14/590,257

(22) Filed: Jan. 6, 2015

(65) Prior Publication Data
US 2015/0255722 A1 Sep. 10, 2015

(30) Foreign Application Priority Data
Mar. 6, 2014 (KR) .................. 10-2014-0026807

(51) Int. Cl.
*H01L 51/00* (2006.01)
*H01L 27/32* (2006.01)
*G06F 3/044* (2006.01)
*G06F 3/041* (2006.01)
*G02F 1/1333* (2006.01)

(52) U.S. Cl.
CPC ............ *H01L 51/0024* (2013.01); *G06F 3/044* (2013.01); *G06F 3/0412* (2013.01); *H01L 27/323* (2013.01); *H01L 51/003* (2013.01); *G02F 1/1333* (2013.01); *G02F 1/13338* (2013.01); *G06F 2203/04103* (2013.01)

(58) Field of Classification Search
CPC ............ H01L 51/0024; H01L 27/3248; H01L 27/323; G02F 1/133308; G02F 2001/133325
See application file for complete search history.

(56) References Cited

U.S. PATENT DOCUMENTS

| 6,078,274 A * | 6/2000 | Inou .................. G06F 3/045 178/18.01 |
| 8,456,444 B2 | 6/2013 | Ishizaki et al. |
| 2007/0062739 A1* | 3/2007 | Philipp .................. G06F 3/044 178/18.06 |
| 2008/0062139 A1* | 3/2008 | Hotelling ............ G02F 1/13338 345/173 |
| 2008/0266273 A1* | 10/2008 | Slobodin ............ G02F 1/13338 345/174 |
| 2009/0188726 A1* | 7/2009 | Chang .................... G06F 3/045 178/18.03 |
| 2012/0113027 A1 | 5/2012 | Song et al. |
| 2013/0038569 A1 | 2/2013 | Kim et al. |
| 2013/0115446 A1 | 5/2013 | Hwang et al. |
| 2015/0138494 A1 | 5/2015 | Kim et al. |

FOREIGN PATENT DOCUMENTS

| JP | 2012071924 A | 4/2012 |
| JP | 2012215765 A | 11/2012 |

(Continued)

*Primary Examiner* — John P Dulka
(74) *Attorney, Agent, or Firm* — Cantor Colburn LLP

(57) ABSTRACT

A method of manufacturing a display apparatus includes: joining a first thin-film glass substrate onto a first carrier substrate; providing a touch pattern unit on a surface of the first thin-film glass substrate, which is opposite to a surface facing the first carrier substrate; separating the first thin-film glass substrate from the first carrier substrate; turning over the first thin-film glass substrate and joining the turned over first thin-film glass substrate onto the first carrier substrate; joining a second thin-film glass substrate onto a second carrier substrate; providing a display unit between the surface of the first thin-film glass substrate opposite to the surface on which the touch pattern unit is provided and a surface of the second thin-film glass substrate, which is opposite to a surface facing the second carrier substrate; and removing the first carrier substrate and the second carrier substrate.

20 Claims, 5 Drawing Sheets

(56) References Cited

FOREIGN PATENT DOCUMENTS

| | | |
|---|---|---|
| JP | 2013015989 A | 1/2013 |
| JP | 2013130607 A | 7/2013 |
| JP | 2013174900 A | 9/2013 |
| KR | 101073835 B1 | 10/2011 |
| KR | 101305684 B1 | 9/2013 |
| KR | 1020150056316 A | 5/2015 |

* cited by examiner

METHOD OF MANUFACTURING DISPLAY APPARATUS INCLUDING TOUCH PATTERN UNIT

This application claims priority to Korean Patent Application No. 10-2014-0026807, filed on Mar. 6, 2014, and all the benefits accruing therefrom under 35 U.S.C. §119, the content of which in its entirety is herein incorporated by reference.

BACKGROUND

1. Field

Exemplary embodiments of the invention relate to a method of manufacturing a display apparatus.

2. Description of the Related Art

Recently, various types of display apparatuses have been used. Specifically, thin and lightweight display apparatuses tend to be widely used.

More specifically, portable thin and flat display apparatuses tend to be highlighted. In addition, a technique of applying a touch panel function to a flat display apparatus has been used.

A touch panel functions as an input device by a touch of a finger of a user, a pen, or the like without a separate unit such as a keyboard or the like, and the touch panel has been recently widely used in various fields.

The touch panel typically includes a plurality of conductive patterns which commonly have conductive patterns arranged in one direction and conductive patterns arranged in another direction crossing the one direction.

Since such a display apparatus includes various members for a display function and various members for a touch panel function, a display apparatus having the two functions may not be effectively manufactured with desired quality.

SUMMARY

One or more exemplary embodiment of the invention includes a method of manufacturing a display apparatus.

According to one or more exemplary embodiment of the invention, a method of manufacturing a display apparatus includes: joining a first thin-film glass substrate onto a first carrier substrate; providing a touch pattern unit for sensing a touch of a user on a surface of the first thin-film glass substrate, which is opposite to a surface thereof facing the first carrier substrate; separating the first thin-film glass substrate, on which the touch pattern unit is provided, from the first carrier substrate; turning over the first thin-film glass substrate to allow the touch pattern unit to face the first carrier substrate and joining the turned first thin-film glass substrate onto the first carrier substrate; joining a second thin-film glass substrate onto a second carrier substrate; providing a display unit for displaying an image between the surface of the first thin-film glass substrate opposite to the surface thereof on which the touch pattern unit is provided and a surface of the second thin-film glass substrate, which is opposite to a surface thereof facing the second carrier substrate; and removing the first carrier substrate and the second carrier substrate.

In an exemplary embodiment, the joining the first thin-film glass substrate onto the first carrier substrate may include: providing a surface treatment layer having a hydrophobic property on one surface of the first carrier substrate by performing a surface treatment on the one surface of the first carrier substrate; and arranging the first thin-film glass substrate to contact the surface treatment layer the one surface of the first carrier substrate, and the joining the second thin-film glass substrate onto the second carrier substrate may include: providing a surface treatment layer having a hydrophobic property on one surface of the second carrier substrate by performing a surface treatment on the one surface of the second carrier substrate; and arranging the second thin-film glass substrate to contact the surface treatment layer the one surface of the second carrier substrate.

In an exemplary embodiment, the providing the surface treatment layer on the one surface of the first carrier substrate may include coating a solution including hexamethyldisilazane ("HMDS") on the one surface of the first carrier substrate, and the providing the surface treatment layer on the one surface of the second carrier substrate may include coating a solution including HMDS on the one surface of the second carrier substrate.

In an exemplary embodiment, the providing the surface treatment layer on the one surface of the first carrier substrate may include providing an inorganic layer on the one surface of the first carrier substrate and controlling the surface roughness of the inorganic layer on the one surface of the first carrier substrate, and the providing the surface treatment layer on the one surface of the second carrier substrate may include providing an inorganic layer on the one surface of the second carrier substrate, and controlling the surface roughness of the inorganic layer on the one surface of the second carrier substrate.

In an exemplary embodiment, the turning-over the first thin-film glass substrate to allow the touch pattern unit to face the first carrier substrate and the joining of the turned over first thin-film glass substrate onto the first carrier substrate may include: providing a surface treatment layer having a hydrophobic property on one surface of the first carrier substrate by performing a surface treatment on the one surface of the first carrier substrate; and arranging the first thin-film glass substrate to allow the touch pattern unit to contact the surface treatment layer.

In an exemplary embodiment, the providing the surface treatment layer may include coating a solution including HMDS on the one surface of the first carrier substrate.

In an exemplary embodiment, the providing the surface treatment layer may include providing an inorganic layer on the one surface of the first carrier substrate and controlling the surface roughness of the inorganic layer.

In an exemplary embodiment, the providing the touch pattern unit for sensing the touch of the user on the surface of the first thin-film glass substrate opposite to the surface thereof facing the first carrier substrate may include providing a protective layer on a surface of the touch pattern unit, which is opposite to a surface thereof facing the first thin-film glass substrate.

In an exemplary embodiment, the turning-over the first thin-film glass substrate to allow the touch pattern unit to face the first carrier substrate and the joining the turned over first thin-film glass substrate onto the first carrier substrate may include arranging the first thin-film glass substrate to allow the protective layer of the touch pattern unit to face the first carrier substrate.

In an exemplary embodiment, a surface of the protective layer opposite to a surface thereof facing the first thin-film glass substrate may be a planar surface.

In an exemplary embodiment, the protective layer may include an organic material.

In an exemplary embodiment, the providing the touch pattern unit may include providing a first conductive pattern and a second conductive pattern spaced apart from the first conductive pattern, and the protective layer may be provided on the first conductive pattern and the second conductive pattern.

In an exemplary embodiment, the providing the touch pattern unit may include: providing a plurality of first conductive patterns; providing a second conductive pattern spaced from the first conductive patterns; providing a bridge to connect the first conductive patterns to each other; and providing an insulating pattern between the second conductive pattern and the bridge.

In an exemplary embodiment, the providing the display unit may include providing a liquid crystal layer between the first thin-film glass substrate and the second thin-film glass substrate.

In an exemplary embodiment, the providing the display unit may include providing a color filter between the first thin-film glass substrate and the second thin-film glass substrate.

In an exemplary embodiment, the providing the color filter may include providing the color filter on the surface of the first thin-film glass substrate opposite to the surface thereof on which the touch pattern unit is provided.

In an exemplary embodiment, the providing the display unit may include providing a thin-film transistor, which is electrically connected to the liquid crystal layer, on the surface of the second thin-film glass substrate opposite to the surface thereof facing the second carrier substrate.

In an exemplary embodiment, the providing the display unit may include providing an organic light-emitting device between the first thin-film glass substrate and the second thin-film glass substrate, and the organic light-emitting device may include a first electrode, a second electrode disposed opposite to the first electrode, and an intermediate layer disposed between the first electrode and the second electrode and including an organic emission layer.

In an exemplary embodiment, the providing the organic light-emitting device may include providing the organic light-emitting device on the surface of the second thin-film glass substrate opposite to the surface thereof facing the second carrier substrate.

In an exemplary embodiment, the providing the display unit may include providing a thin-film transistor, which is electrically connected to the organic emission layer, on the surface of the second thin-film glass substrate opposite to the surface thereof facing the second carrier substrate.

BRIEF DESCRIPTION OF THE DRAWINGS

The above and other features of the invention will become more apparent by describing in further detail exemplary embodiments thereof with reference to the accompanying drawings in which.

DETAILED DESCRIPTION

Figure 1:
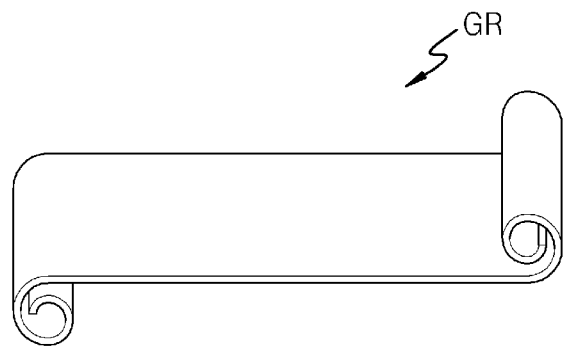
FIGS. 1 to 14 illustrate an exemplary embodiment of a method of manufacturing a display apparatus, according to the invention.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Herein, the x-axis, the y-axis, and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

When a certain embodiment may be implemented differently, a specific process order may be performed differently from the described order. For example, two consecutively described processes may be performed substantially at the same time or performed in an order opposite to the described order.

As used herein, expressions such as "at least one of," when preceding a list of elements, modify the entire list of elements and do not modify the individual elements of the list.

Hereinafter, exemplary embodiments of the invention will be described in further detail with reference to the accompanying drawings.

FIGS. 1 to 14 illustrate an exemplary embodiment of a method of manufacturing a display apparatus, according to the invention.

In an exemplary embodiment, the display apparatus includes various members to implement a display function of realizing an image to a user side and a touch function of sensing a touch of a user, e.g., a touch of a finger, a pen, or the like.

An exemplary embodiment of the method of manufacturing a display apparatus will now be described in detail with reference to FIGS. 1 to 14.

First, referring to FIG. 1, a thin-film glass roll GR is prepared. The thin-film glass roll GR may have a thickness of about 0.2 millimeter (mm) or less. In such an embodiment, the thickness of the thin-film glass roll GR may be about 0.1 mm or less, such that the final thickness of the finally manufactured display apparatus may be substantially minimized.

Figure 2:

Thereafter, as shown in FIG. 2, a first thin-film glass substrate TG1 is prepared by cutting the thin-film glass roll GR by a predetermined size.

FIGS. 1 and 2 show an exemplary embodiment where the first thin-film glass substrate TG1 is prepared using the thin-film glass roll GR. However, the invention is not limited thereto, and in an alternative exemplary embodiment, various processes of preparing the first thin-film glass substrate TG1 may be used. In one exemplary embodiment, for example, the first thin-film glass substrate TG1 may be prepared without a separate cutting process to manage a degree of flatness on side surfaces of the first thin-film glass substrate TG1.

Figure 3:
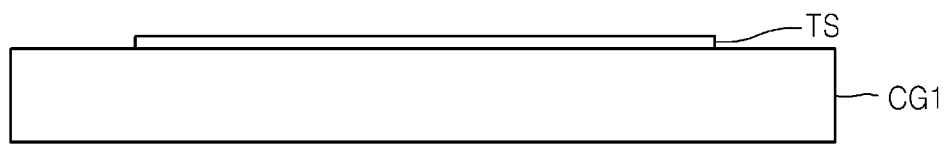

Thereafter, referring to FIG. 3, a first carrier substrate CG1 is prepared, and a surface treatment layer TS is provided, e.g., formed, on one surface (e.g., an upper surface) of the first carrier substrate CG1 by performing a surface treatment on the one surface of the first carrier substrate CG1.

The first carrier substrate CG1 may include or be formed of various materials. In an exemplary embodiment, the first carrier substrate CG1 may be formed of a material substantially similar to a material of the first thin-film glass substrate TG1, i.e., a glass material. The first carrier substrate CG1 allows the first thin-film glass substrate TG1 to be effectively handled during a process of manufacturing a display apparatus. In such an embodiment, the first carrier substrate CG1 may effectively prevent a decrease in process precision due to bending of the first thin-film glass substrate TG1 and effectively prevent damage or deformation of the first thin-film glass substrate TG1, thereby improving quality of the display apparatus.

The surface treatment layer TS is formed to have a hydrophobic property by performing a surface treatment on the one surface of the first carrier substrate CG1. The surface treatment layer TS having the hydrophobic property may be formed using various methods. In one exemplary embodiment, for example, the surface treatment layer TS may be formed to have the hydrophobic property by coating a solution, including hexamethyldisilazane ("HMDS"), on the one surface of the first carrier substrate CG1.

The surface treatment layer TS having the hydrophobic property may be formed using various methods. In an alternative exemplary embodiment, the surface treatment layer TS having the hydrophobic property may be provided or formed by coating an inorganic material on the one surface of the first carrier substrate CG1. In such an embodiment, the roughness of a surface of the inorganic material may be controlled. In such an embodiment, when the roughness of the surface of the inorganic material is large, separation of the first carrier substrate CG1 and the first thin-film glass substrate TG1 after joining the first carrier substrate CG1 and the first thin-film glass substrate TG1, which is to be described below, may not be effectively or efficiently performed, and thus, the roughness of the surface of the inorganic material is controlled to be a value less than a predetermined reference value.

The surface treatment layer TS has a very small thickness, e.g., a thickness of several angstroms. In an exemplary embodiment, as shown in FIG. 3, the surface treatment layer TS may be patterned, but the invention is not limited thereto. In an alternative exemplary embodiment, the surface treatment layer TS may be formed to cover substantially the entire upper surface of the first carrier substrate CG1 without undergoing a separate patterning process.

In an exemplary embodiment, as shown in FIGS. 1 to 3, the surface treatment layer TS is formed on the one surface of the first carrier substrate CG1 after preparing the first thin-film glass substrate TG1, but the invention is not limited thereto.

In an alternative exemplary embodiment, the first thin-film glass substrate TG1 may be prepared after forming the surface treatment layer TS on the one surface of the first carrier substrate CG1.

In another alternative exemplary embodiment, the preparing of the first thin-film glass substrate TG1 and the forming of the surface treatment layer TS on the one surface of the first carrier substrate CG1 may be independently performed, e.g., may be performed at the same time, not being limited to a predetermined order.

Figure 4:
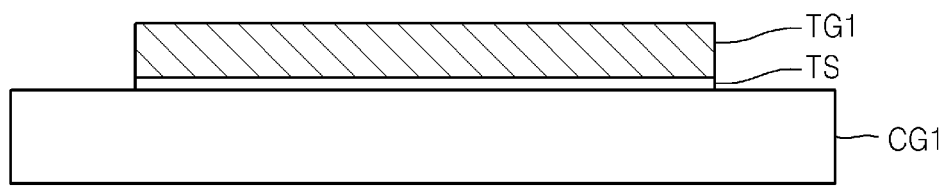

Thereafter, referring to FIG. 4, the first thin-film glass substrate TG1 is disposed on, e.g., joined with, the first carrier substrate CG1.

In an exemplary embodiment, the first carrier substrate CG1 and the first thin-film glass substrate TG1 may be attached to each other by joining the first thin-film glass substrate TG1 with the surface treatment layer TS formed on the one surface of the first carrier substrate CG1.

When the first thin-film glass substrate TG1 is joined with the first carrier substrate CG1, the first thin-film glass substrate TG1 and the first carrier substrate CG1 are detachably joined such that the first carrier substrate CG1 and the first thin-film glass substrate TG1 may be separated from each other by applying a certain amount of force thereto, due to the surface treatment layer TS having the hydrophobic property.

Figure 5:
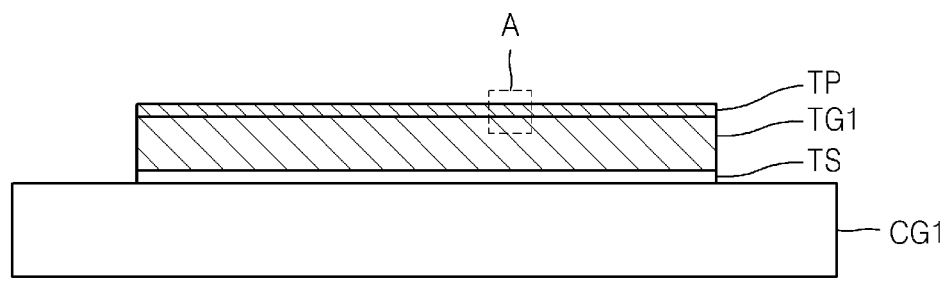

Thereafter, referring to FIG. 5, a touch pattern unit TP is provided, e.g., formed, on one surface (e.g., an upper surface) of the first thin-film glass substrate TG1, i.e., a surface of the first thin-film glass substrate TG1 that is opposite to a surface thereof facing the first carrier substrate CG1, such that the first thin-film glass substrate TG1 is disposed between the touch pattern unit TP and the first carrier substrate CG1.

Figure 6:
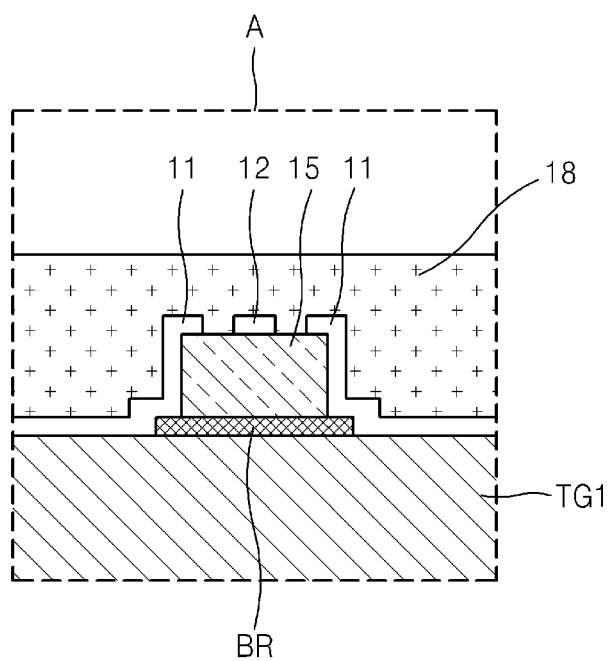

The touch pattern unit TP functions as a touch panel for sensing a touch of a user. The touch pattern unit TP will now be described in greater detail with reference to FIG. 6. FIG. 6 is an enlarged view of a portion A of FIG. 5.

Referring to FIG. 6, the touch pattern unit TP may include a first conductive pattern 11, a second conductive pattern 12, a bridge BR, an insulating pattern 15 and a protective layer 18.

The first conductive patterns 11 are separate from (e.g., spaced apart from) each other and connected to each other through the bridge BR. In such an embodiment, the bridge BR is disposed between two separate first conductive patterns 11, where the bridge BR contacts a portion of one surface of each of the two separate first conductive patterns 11.

The first conductive patterns 11 and the bridge BR may include or be formed of various materials. In one exemplary embodiment, for example, the first conductive pattern 11 may be formed of a light-transmissive conductive material, and the bridge BR may be formed of an opaque metal.

The second conductive pattern 12 is separate from (e.g., spaced apart from) the first conductive pattern 11 and may have a linear shape extending in a direction of crossing the first conductive pattern 11. The second conductive pattern 12 may include or be formed of a light-transmissive conductive material The second conductive pattern 12 is separate from (e.g., spaced apart from) the bridge BR by the insulating pattern 15.

The protective layer 18 defines an uppermost surface of the touch pattern unit TP. In an exemplary embodiment, the protective layer 18 is disposed to be disposed farthest from the first thin-film glass substrate TG1 among members of the touch pattern unit TP. The protective layer 18 is provided, e.g., formed, on the first conductive pattern 11, the second conductive pattern 12, the bridge BR and the insulating pattern 15.

In an alternative exemplary embodiment, the protective layer 18 may be provided to cover the first conductive pattern 11, the second conductive pattern 12, the bridge BR and the insulating pattern 15.

The protective layer 18 may have a planar surface. A surface of the protective layer 18 that is opposite to a surface thereof facing the first thin-film glass substrate TG1 may be formed as the planar surface.

In an exemplary embodiment, the protective layer 18 may include an organic material. In such an embodiment, where the protective layer 18 includes the organic material, the protective layer 18 may be efficiently formed to cover the first conductive pattern 11, the second conductive pattern 12, the bridge BR and the insulating pattern 15 and to have a planar surface.

Figure 7:

Thereafter, referring to FIG. 7, the first carrier substrate CG1 is separated from the first thin-film glass substrate TG1. As described above, in such an embodiment, the surface treatment layer TS having the hydrophobic property is formed on the one surface of the first carrier substrate CG1, such that the first thin-film glass substrate TG1, which contacts the surface treatment layer TS having the hydrophobic property, is effectively or efficiently separated from the surface treatment layer TS by applying a certain amount of force. In such an embodiment, the first thin-film glass substrate TG1 having a hydrophilic surface and the surface treatment layer TS having the hydrophobic property are easily separated from each other by a small force without a high-temperature process or additional chemical additives.

Figure 8:
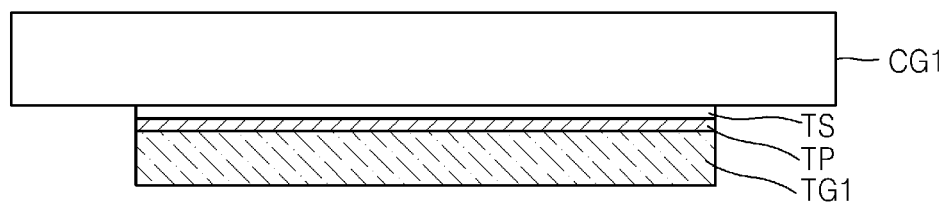

Thereafter, referring to FIG. 8, the first thin-film glass substrate TG1 is turned over and is joined with the first carrier substrate CG1 again. In an exemplary embodiment, the first thin-film glass substrate TG1 is joined with the first carrier substrate CG1 so that the touch pattern unit TP on the surface of the first thin-film glass substrate TG1 faces the first carrier substrate CG1.

In an exemplary embodiment, after the surface treatment layer TS having the hydrophobic property is formed on one surface of the first carrier substrate CG1, the first thin-film glass substrate TG1 contacts the surface treatment layer TS. In such an embodiment, the touch pattern unit TP may contact the surface treatment layer TS. In such an embodiment, the planar surface of the protective layer 18 of the touch pattern unit TP may contact the surface treatment layer TS.

In another exemplary embodiment, instead of separately forming the surface treatment layer TS having the hydrophobic property on the one surface of the first carrier substrate CG1, the surface treatment layer TS previously formed as shown in FIG. 3 may be used as it is.

Figure 9:
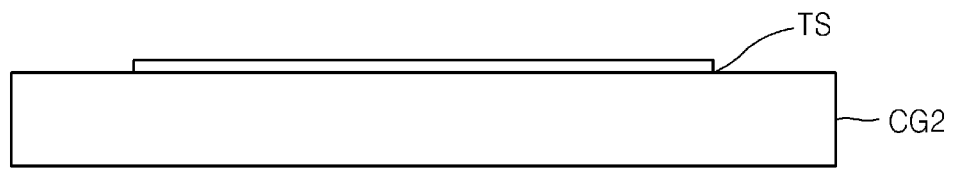

Thereafter, referring to FIG. 9, a second carrier substrate CG2 is prepared, and the surface treatment layer TS is provided, e.g., formed, on one surface of the second carrier substrate CG2 by performing a surface treatment on the one surface of the second carrier substrate CG2.

The second carrier substrate CG2 may include or be formed of various materials. In one exemplary embodiment, for example, the second carrier substrate CG2 may be formed of the same material as the first carrier substrate CG1, e.g., a glass material.

The surface treatment layer TS is formed to have a hydrophobic property by performing a surface treatment on the one surface of the second carrier substrate CG2. The surface treatment layer TS having the hydrophobic property may be formed using various methods. In one exemplary embodiment, for example, the surface treatment layer TS may be formed to have a hydrophobic property by coating a solution including HMDS on the one surface of the second carrier substrate CG2.

The surface treatment layer TS having the hydrophobic property may be formed using various methods. In an alternative exemplary embodiment, the surface treatment layer TS having the hydrophobic property may be formed by coating an inorganic material on the one surface of the second carrier substrate CG2. In such an embodiment, the roughness of the surface of the inorganic material may be controlled. In such an embodiment, when the roughness of the surface of the inorganic material is large, separation of the second carrier substrate CG2 and a second thin-film glass substrate TG2 after joining the second carrier substrate CG2 and the second thin-film glass substrate TG2, which is to be described below, may not be efficiently or effectively performed. In such an embodiment, the roughness of the surface of the inorganic material may be controlled to have a value less than a predetermined reference value.

The surface treatment layer TS has a very small thickness, e.g., a thickness of several angstroms. In an exemplary embodiment, as shown in FIG. 9, the surface treatment layer TS is patterned, but the invention is not limited thereto. In an alternative exemplary embodiment, the surface treatment layer TS may be provided to cover substantially the entire upper surface of the second carrier substrate CG2 without undergoing a separate patterning process.

Figure 10:
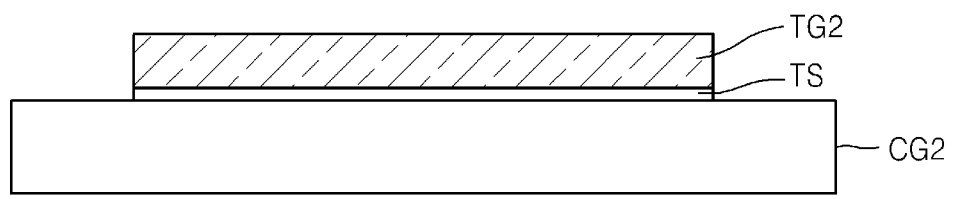

Thereafter, referring to FIG. 10, the second carrier substrate CG2 and the second thin-film glass substrate TG2 are joined so that the second thin-film glass substrate TG2 contacts the surface treatment layer TS formed on the one surface of the second carrier substrate CG2.

In an exemplary embodiment, the second thin-film glass substrate TG2 may have a thickness of about 0.2 mm or less. In an exemplary embodiment, the thickness of the second thin-film glass substrate TG2 may be about 0.1 mm or less.

In an exemplary embodiment, the second thin-film glass substrate TG2 may be prepared using one of various processes. In an exemplary embodiment, the second thin-film glass substrate TG2 may be prepared by preparing a thin-film glass roll GR and cutting the thin-film glass roll GR by a predetermined size as described above with respect to the first thin-film glass substrate TG1. In an alternative exemplary embodiment, the second thin-film glass substrate TG2 may be prepared by a method that does not include using a thin-film glass roll GR and performing a separate cutting process.

The joining of the second thin-film glass substrate TG2 with the second carrier substrate CG2 allows the second thin-film glass substrate TG2 to be effectively or efficiently handled during a process of manufacturing a display apparatus. In such an embodiment, the second carrier substrate CG2 may effectively prevent a decrease in process precision due to bending of the second thin-film glass substrate TG2 and effectively prevent damage or deformation of the second thin-film glass substrate TG2, thereby improving quality of the display apparatus.

When the second thin-film glass substrate TG2 is joined with the second carrier substrate CG2, the second carrier substrate CG2 and the second thin-film glass substrate TG2 may be joined by contacting the second thin-film glass substrate TG2 with the surface treatment layer TS formed on the one surface of the second carrier substrate CG2.

When the second thin-film glass substrate TG2 is joined with the second carrier substrate CG2, the second thin-film glass substrate TG2 and the second carrier substrate CG2 are detachably joined such that the second thin-film glass substrate TG2 and the second carrier substrate CG2 may be separated from each other by applying a force thereto, due to the surface treatment layer TS having the hydrophobic property.

Figure 11:
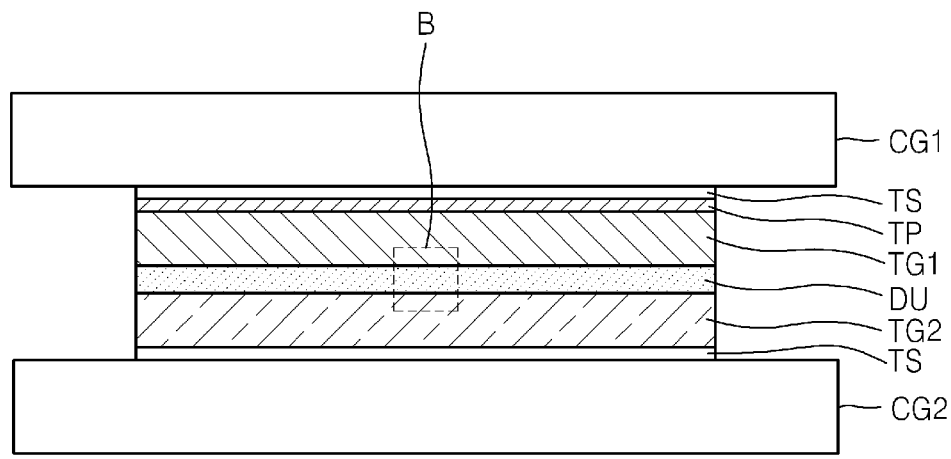

Thereafter, referring to FIG. 11, after disposing the first carrier substrate CG1 to face the second carrier substrate CG2, a display unit DU is formed between the first carrier substrate CG1 and the second carrier substrate CG2.

In an exemplary embodiment, when the first carrier substrate CG1 is disposed to face the second carrier substrate CG2, the first thin-film glass substrate TG1 formed on the first carrier substrate CG1 faces the second thin-film glass substrate TG2 formed on the second carrier substrate CG2.

In such an embodiment, the structure of the display unit DU is not limited to a specific structure. In such an embodiment, the display unit DU may have any structure for displaying an image to a viewer. In one exemplary embodiment, for example, the display unit DU may include a liquid crystal layer. In another exemplary embodiment, for example, the display unit DU may include an organic light-emitting device.

Figure 12:
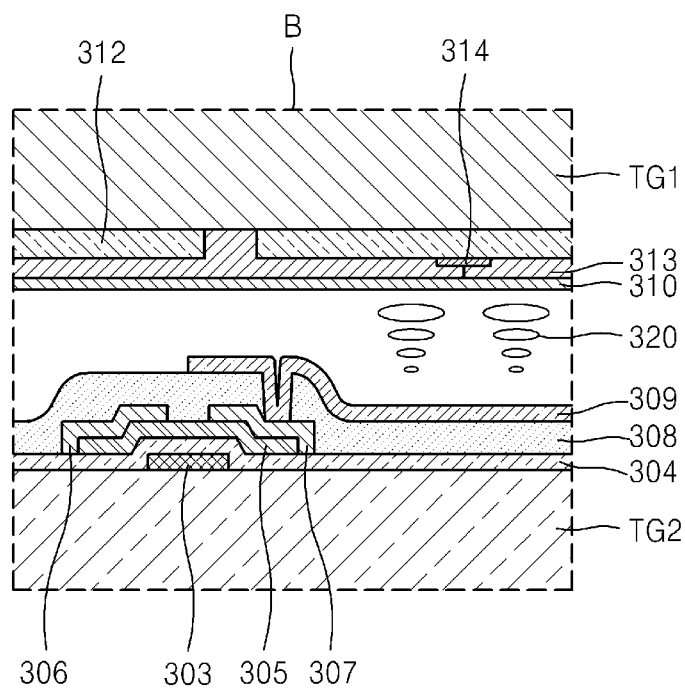
Figure 13:
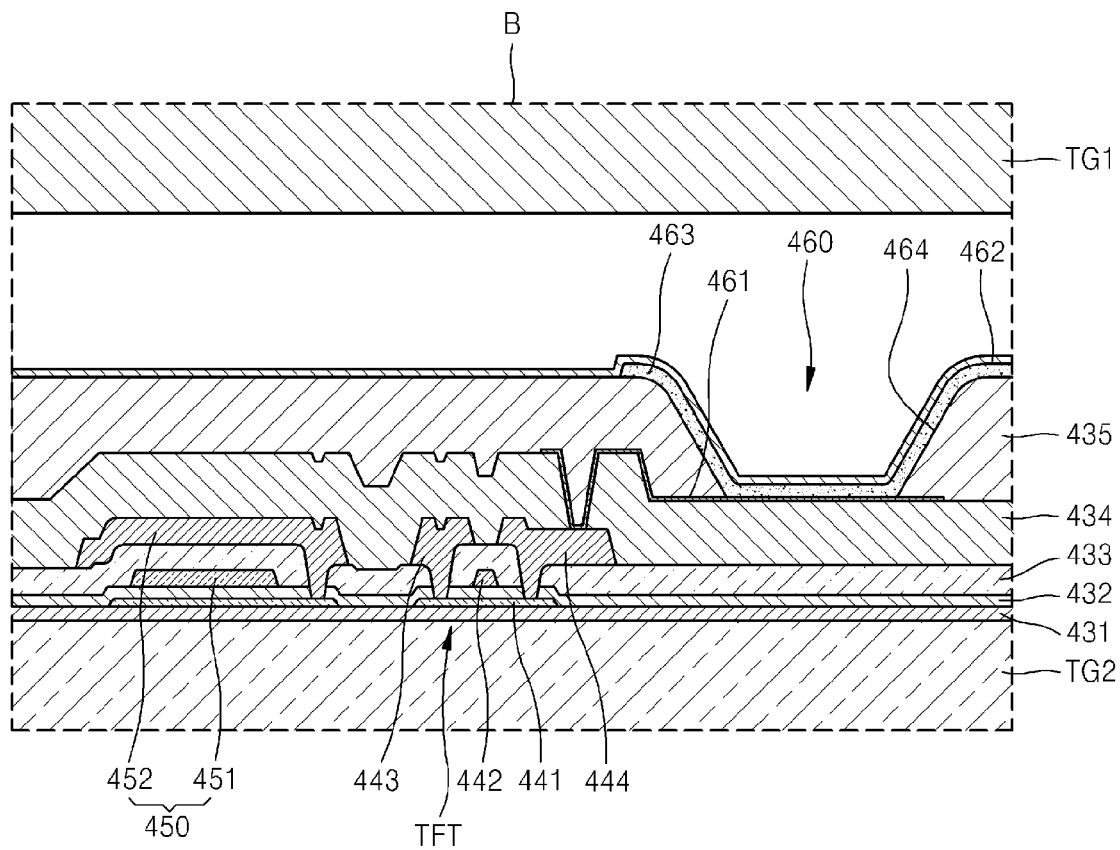

An exemplary embodiment of the display unit DU will now be described in detail with reference to FIGS. 12 and 13. FIGS. 12 and 13 are enlarged views of a portion B of FIG. 11 showing an exemplary embodiment of the display unit DU according to the invention.

First, an example of the display unit DU will be described with reference to FIG. 12.

Referring to FIG. 12, in an exemplary embodiment, the display unit DU includes a liquid crystal layer 320. In such an embodiment, as shown in FIG. 12, the display unit DU has a form of a liquid crystal display device. Such an embodiment of the display unit DU will now be described in detail.

In such an embodiment, the display unit DU includes the liquid crystal layer 320, a color filter 313, and the like. In such an embodiment, the display unit DU may include a thin-film transistor electrically connected to a first electrode 309 of the liquid crystal layer 320, where the thin-film transistor includes a gate electrode 303, an active layer 305, a source electrode 306 and a drain electrode 307.

The liquid crystal layer 320 is disposed between the first thin-film glass substrate TG1 and the second thin-film glass substrate TG2.

In an exemplary embodiment of a method of manufacturing the display unit DU shown in FIG. 12, the gate electrode 303, the active layer 305, the source electrode 306 and the drain electrode 307 are provided, e.g., formed, on the second thin-film glass substrate TG2.

In such an embodiment, the gate electrode 303 is provided to have a predetermined pattern on the second thin-film glass substrate TG2, a gate insulating layer 304 is provided on the gate electrode 303, and the active layer 305 is provided to have a predetermined pattern on the gate insulating layer 304. The source electrode 306 and the drain electrode 307 are provided on the active layer 305. In such an embodiment, an ohmic contact layer (not shown) may be further provided between the active layer 305 and the source electrode 306 and between the active layer 305 and the drain electrode 307.

In such an embodiment, a passivation layer 308 is provided to cover the source electrode 306 and the drain electrode 307. In such an embodiment, the passivation layer 308 is etched to expose the source electrode 306 or the drain electrode 307, and the first electrode 309 is provided to have a predetermined pattern and to be electrically connected to the exposed electrode.

In an exemplary embodiment, as shown in FIG. 12, the thin-film transistor may have a bottom-gate structure, but not being limited thereto. In an alternative exemplary embodiment, a thin-film transistor may have a top-gate structure.

The providing of the gate electrode 303, the gate insulating layer 304, the active layer 305, the source electrode 306, the drain electrode 307, the passivation layer 308, and the first electrode 309 on the second thin-film glass substrate TG2 may be performed before disposing the first thin-film glass substrate TG1 to face the second thin-film glass substrate TG2, as shown in FIG. 11.

A buffer unit 312 is provided on the first thin-film glass substrate TG1. The buffer unit 312 may be formed using various organic materials. The buffer unit 312 provides a planar surface on a lower portion of the first thin-film glass substrate TG1 to allow the color filter 313 provided thereon to have a substantially uniform surface. In an alternative exemplary embodiment, the buffer unit 312 may be omitted.

A black matrix 314 is provided to have a predetermined pattern on the buffer unit 312. The black matrix 314 effectively prevents color mixing and interference of visible lights realized through the color filter 313.

The color filter 313 is provided on the black matrix 314. The color filter 313 is also provided on the buffer unit 312. A second electrode 310 is provided on a lower surface of the color filter 313.

The providing of the buffer unit 312, the black matrix 314, the color filter 313, and the second electrode 310 on the first thin-film glass substrate TG1 may be performed before disposing the first thin-film glass substrate TG1 to face the second thin-film glass substrate TG2, as shown in FIG. 11.

The liquid crystal layer 320 is provided between the first electrode 309 and the second electrode 310, and the providing of the liquid crystal layer 320 may be performed by disposing the first thin-film glass substrate TG1 face the second thin-film glass substrate TG2 and injecting a liquid crystal molecular material between the first thin-film glass substrate TG1 and the second thin-film glass substrate TG2.

In an alternative exemplary embodiment, an alignment layer (not shown) may be provided to align the liquid crystal layer 320. The alignment layer may be disposed to correspond to the upper and lower surface of the liquid crystal layer 320.

In an alternative exemplary embodiment, a space in which the liquid crystal layer 320 is disposed may be maintained using a spacer (not shown). In an exemplary embodiment, a sealing member (not shown) for bonding the first thin-film glass substrate TG1 and the second thin-film glass substrate TG2 may be provided at the outer edge of the liquid crystal layer 320.

FIG. 12 shows one exemplary embodiment of the display unit DU including a liquid crystal display device, but the invention is not limited thereto. In an alternative exemplary embodiment of the display unit DU including a liquid crystal display device, at least one of the second electrode 310, the color filter 313, and the black matrix 314 may be provided on the second thin-film glass substrate TG2.

An alternative exemplary embodiment of the display unit DU will now be described with reference to FIG. 13.

Referring to FIG. 13, an exemplary embodiment of the display unit DU includes an organic light-emitting device 460 and a thin-film transistor TFT. Hereinafter, an exemplary embodiment of manufacturing the display unit DU will now be described in detail.

In such an embodiment, a buffer layer 431, including an insulating material, may be provided on the second thin-film glass substrate TG2 to provide a planar surface on the second thin-film glass substrate TG2 and to effectively prevent intrusion of moisture and foreign substances in a direction towards the second thin-film glass substrate TG2. In an alternative exemplary embodiment, the buffer layer 431 may be omitted.

The thin-film transistor TFT, a capacitor 450 and the organic light-emitting device 460 are provided, e.g., formed, on the buffer layer 431.

The thin-film transistor TFT includes an active layer 441, a gate electrode 442, a source electrode 443 and a drain electrode 444. The capacitor 450 includes a first capacitor electrode 451 and a second capacitor electrode 452. The organic light-emitting device 460 includes a first electrode 461, a second electrode 462, and an intermediate layer 463.

In an exemplary embodiment, the active layer 441 of the thin-film transistor TFT is provided to have a predetermined pattern on an upper surface of the buffer layer 431. A gate insulating layer 432 is provided on the active layer 441. The gate electrode 442 is provided on the gate insulating layer 432 to correspond to a certain region of the active layer 441. An inter-layer insulating layer 433 is provided to cover the gate electrode 442, and the source electrode 443 and the drain electrode 444 are provided on the inter-layer insulating layer 433 to contact certain regions of the active layer 441.

A passivation layer 434 is provided to cover the source electrode 443 and the drain electrode 444, and a separate insulating layer may be further provided on the passivation layer 434 for planarization of the thin-film transistor TFT.

The first electrode 461 is provided on the passivation layer 434. The first electrode 461 is provided to be connected to one of the source electrode 443 and the drain electrode 444, e.g., the drain electrode 444. A pixel-defining layer 435 is provided on the first electrode 461. An opening 464 may be formed through the pixel-defining layer 435, and the intermediate layer 463 is provided inside the opening 464 to correspond to the exposed first electrode 461. The intermediate layer 463 includes an organic emission layer that emits a visible light, and the intermediate layer 463 may include at least one of a hole injection layer, a hole transport layer, an electron transport layer and an electron injection layer, in addition to the organic emission layer.

The second electrode 462 is provided on the intermediate layer 463.

A sealing member (not shown) may be provided to bond the second thin-film glass substrate TG2 and the first thin-film glass substrate TG1.

The providing of the thin-film transistor TFT and the organic light-emitting device 460 on the second thin-film glass substrate TG2 may be performed before disposing the first thin-film glass substrate TG1 to face the second thin-film glass substrate TG2, as shown in FIG. 11.

FIG. 13 shows one exemplary embodiment of the display unit DU including the organic light-emitting device 460, and the invention is not limited thereto.

FIGS. 12 and 13 show some exemplary embodiment of the display unit DU, and the invention is not limited thereto. In an exemplary embodiment, the display unit DU may include one of various types of display device.

Figure 14:
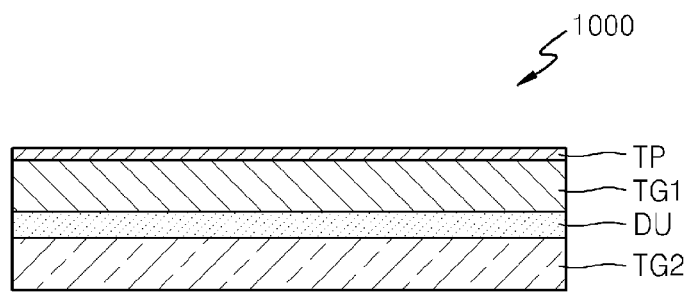

Thereafter, referring to FIG. 14, a display apparatus 1000 is finally completed by removing the first carrier substrate CG1 and the second carrier substrate CG2.

As described above, an exemplary embodiment of the display apparatus 1000 has the display unit DU disposed between the first thin-film glass substrate TG1 and the second thin-film glass substrate TG2 to display an image. The display apparatus 1000 includes the touch pattern unit TP, which is disposed on a surface of the first thin-film glass substrate TG1 that is opposite to a surface thereof facing the display unit DU.

In such an embodiment, through the display unit DU and the touch pattern unit TP, the display apparatus 1000 simultaneously realizes an image display function and a touch sensing function.

The display apparatus 1000 manufactured by an exemplary embodiment of the manufacturing method according to the invention has the touch pattern unit TP provided on one surface of the first thin-film glass substrate TG1 of the display apparatus 1000 without a separate panel for realizing the touch sensing function, thereby increasing user convenience.

A thickness of the display apparatus 1000 may be reduced using the first thin-film glass substrate TG1 and the second thin-film glass substrate TG2, each having a thickness of about 0.1 mm or less.

In exemplary embodiments of the manufacturing process described herein, where the first thin-film glass substrate TG1 and the second thin-film glass substrate TG2 are joined with the first carrier substrate CG1 and the second carrier substrate CG2, respectively, the first thin-film glass substrate TG1 and the second thin-film glass substrate TG2 may be effectively controlled by controlling the first carrier substrate CG1 and the second carrier substrate CG2, such that damage to the first thin-film glass substrate TG1 and the second thin-film glass substrate TG2 may be effectively prevented, and the manufacturing process of the display apparatus 1000 may be easily performed.

In such embodiments, when the first thin-film glass substrate TG1 and the second thin-film glass substrate TG2 are joined with the first carrier substrate CG1 and the second carrier substrate CG2, respectively, the surface treatment layers TS having the hydrophobic property, which are previously formed on the first carrier substrate CG1 and the second carrier substrate CG2, contact the first thin-film glass substrate TG1 and the second thin-film glass substrate TG2. Accordingly, in such embodiments of the manufacturing process of the display apparatus 1000, when the first carrier substrate CG1 and the second carrier substrate CG2 are separated from the first thin-film glass substrate TG1 and the second thin-film glass substrate TG2, respectively, damage to the first thin-film glass substrate TG1 and the second thin-film glass substrate TG2 is effectively prevented without a high-temperature process or chemical additives.

In such embodiments, as shown in FIG. 5, the touch pattern unit TP may be easily formed on the first thin-film glass substrate TG1 when the first thin-film glass substrate TG1 is joined with the first carrier substrate CG1. In such an embodiment, the protective layer 18 may be provided on the uppermost layer of the touch pattern unit TP after providing the touch pattern unit TP and has a planar surface by using an organic material.

Thereafter, as shown in FIG. 7, The first thin-film glass substrate TG1, on which the touch pattern unit TP is provided, may be easily separated from the first carrier substrate CG1, the first thin-film glass substrate TG1 is turned over, and the turned over first thin-film glass substrate TG1 may be easily joined with the first carrier substrate CG1 so that the touch pattern unit TP faces the first carrier substrate CG1.

Accordingly, in such an embodiment, the manufacturing process of the display apparatus 1000 including the touch pattern unit TP may be performed substantially effectively and efficiently, thereby improving characteristics of the touch pattern unit TP and reducing a defect occurring rate of the display unit DU included in the display apparatus 1000.

In such embodiments, the first carrier substrate CG1 and the second carrier substrate CG2 are respectively separated from the first thin-film glass substrate TG1 and the second thin-film glass substrate TG2 without a high-temperature process or chemical additives, and thus damage to the first thin-film glass substrate TG1 and the second thin-film glass substrate TG2 may be effectively prevented, and damage to the first carrier substrate CG1 and the second carrier substrate CG2 may be effectively prevented. Accordingly, the first carrier substrate CG1 and the second carrier substrate CG2 may be reused.

As described above, in exemplary embodiments of a method of manufacturing a display apparatus, according to the invention, manufacturing characteristics and user convenience of the display apparatus may be substantially improved.

It should be understood that the exemplary embodiments described therein should be considered in a descriptive sense only and not for purposes of limitation. Descriptions of features or aspects within each embodiment should typically be considered as available for other similar features or aspects in other embodiments.

While one or more exemplary embodiments of the invention have been described with reference to the figures, it will be understood by those of ordinary skill in the art that various changes in form and details may be made therein without departing from the spirit and scope of the invention as defined by the following claims.

What is claimed is:

1. A method of manufacturing a display apparatus, the method comprising:
   joining a first thin-film glass substrate onto a first carrier substrate;
   providing a touch pattern unit for sensing a touch of a user on a surface of the first thin-film glass substrate, which is opposite to a surface of the first thin-film glass substrate facing the first carrier substrate;
   separating the first thin-film glass substrate, on which the touch pattern unit is provided, from the first carrier substrate;
   turning over the first thin-film glass substrate to allow the touch pattern unit to face the first carrier substrate, and joining the turned first thin-film glass substrate onto the first carrier substrate;
   joining a second thin-film glass substrate onto a second carrier substrate;
   providing a display unit for displaying an image between the surface of the first thin-film glass substrate opposite to the surface of the first thin-film glass substrate on which the touch pattern unit is provided and a surface of the second thin-film glass substrate, which is opposite to a surface of the second thin-film glass substrate facing the second carrier substrate; and
   removing the first carrier substrate and the second carrier substrate.

2. The method of claim 1, wherein
   the joining the first thin-film glass substrate onto the first carrier substrate comprises:
   providing a surface treatment layer having a hydrophobic property on one surface of the first carrier substrate by performing a surface treatment on the one surface of the first carrier substrate; and
   arranging the first thin-film glass substrate to contact the surface treatment layer on the one surface of the first carrier substrate, and
   the joining the second thin-film glass substrate onto the second carrier substrate comprises:
   providing a surface treatment layer having a hydrophobic property on one surface of the second carrier substrate by performing a surface treatment on the one surface of the second carrier substrate; and
   arranging the second thin-film glass substrate to contact the surface treatment layer on the one surface of the second carrier substrate.

3. The method of claim 2, wherein
   the providing the surface treatment layer on the one surface of the first carrier substrate comprises coating a solution including hexamethyldisilazane on the one surface of the first carrier substrate, and
   the providing the surface treatment layer on the one surface of the second carrier substrate comprises coating a solution including hexamethyldisilazane on the one surface of the second carrier substrate.

4. The method of claim 2, wherein
   the providing the surface treatment layer on the one surface of the first carrier substrate comprises providing an inorganic layer on the one surface of the first carrier substrate, and controlling the surface roughness of the inorganic layer on the one surface of the first carrier substrate, and
   the providing the surface treatment layer on the one surface of the second carrier substrate comprises providing an inorganic layer on the one surface of the second carrier substrate, and controlling the surface roughness of the inorganic layer on the one surface of the second carrier substrate.

5. The method of claim 1, wherein the turning-over the first thin-film glass substrate to allow the touch pattern unit to face the first carrier substrate and the joining the turned over first thin-film glass substrate onto the first carrier substrate comprises:
providing a surface treatment layer having a hydrophobic property on one surface of the first carrier substrate by performing a surface treatment on the one surface of the first carrier substrate; and
arranging the first thin-film glass substrate to allow the touch pattern unit to contact the surface treatment layer.

6. The method of claim 5, wherein the providing the surface treatment layer comprises coating a solution including hexamethyldisilazane on the one surface of the first carrier substrate.

7. The method of claim 5, wherein the providing the surface treatment layer comprises providing an inorganic layer on the one surface of the first carrier substrate and controlling the surface roughness of the inorganic layer.

8. The method of claim 1, wherein the providing the touch pattern unit which senses the touch of the user on the surface of the first thin-film glass substrate opposite to the surface thereof facing the first carrier substrate comprises providing a protective layer on a surface of the touch pattern unit, which is opposite to a surface thereof facing the first thin-film glass substrate.

9. The method of claim 8, wherein the turning-over the first thin-film glass substrate to allow the touch pattern unit to face the first carrier substrate and the joining the turned over first thin-film glass substrate onto the first carrier substrate comprises arranging the first thin-film glass substrate to allow the protective layer of the touch pattern unit to face the first carrier substrate.

10. The method of claim 8, wherein a surface of the protective layer, which is opposite to a surface thereof facing the first thin-film glass substrate, is a planar surface.

11. The method of claim 8, wherein the protective layer comprises an organic material.

12. The method of claim 8, wherein
the providing the touch pattern unit comprises providing a first conductive pattern, and a second conductive pattern which is spaced apart from the first conductive pattern, and
the protective layer is provided on the first conductive pattern and the second conductive pattern.

13. The method of claim 12, wherein the providing the touch pattern unit comprises:
providing a plurality of first conductive patterns;
providing a second conductive pattern which is spaced from the first conductive patterns;
providing a bridge which connects the first conductive patterns to each; and
providing an insulating pattern between the second conductive pattern and the bridge.

14. The method of claim 1, wherein the providing the display unit comprises providing a liquid crystal layer between the first thin-film glass substrate and the second thin-film glass substrate.

15. The method of claim 14, wherein the providing the display unit comprises providing a color filter between the first thin-film glass substrate and the second thin-film glass substrate.

16. The method of claim 15, wherein the providing the color filter comprises forming the color filter on the surface of the first thin-film glass substrate that is opposite to the surface thereof on which the touch pattern unit is formed.

17. The method of claim 14, wherein the providing the display unit comprises providing a thin-film transistor, which is electrically connected to the liquid crystal layer, on the surface of the second thin-film glass substrate opposite to the surface thereof facing the second carrier substrate.

18. The method of claim 1, wherein
the providing the display unit comprises providing an organic light-emitting device between the first thin-film glass substrate and the second thin-film glass substrate,
the organic light-emitting device comprises:
a first electrode;
a second electrode disposed opposite to the first electrode; and
an intermediate layer disposed between the first electrode and the second electrode and comprising an organic emission layer.

19. The method of claim 18, wherein the providing the organic light-emitting device comprises providing the organic light-emitting device on the surface of the second thin-film glass substrate opposite to the surface thereof facing the second carrier substrate.

20. The method of claim 18, wherein the providing the display unit comprises providing a thin-film transistor, which is electrically connected to the organic emission layer, on the surface of the second thin-film glass substrate opposite to the surface thereof facing the second carrier substrate.

* * * * *